(12) United States Patent
Chang et al.

(10) Patent No.: US 8,574,989 B2
(45) Date of Patent: Nov. 5, 2013

(54) SEMICONDUCTOR STRUCTURE HAVING A POLYSILICON STRUCTURE AND METHOD OF FORMING SAME

(75) Inventors: Che-Cheng Chang, New Taipei (TW); Po-Chi Wu, Zhubei (TW); Buh-Kuan Fang, Zhubei (TW); Jr-Jung Lin, Wurih Township (TW); Ryan Chia-Jen Chen, Chiayi (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/314,462

(22) Filed: Dec. 8, 2011

(65) Prior Publication Data

US 2013/0146993 A1    Jun. 13, 2013

(51) Int. Cl.
    *H01L 21/336* (2006.01)
(52) U.S. Cl.
    USPC ........... 438/270; 438/164; 438/199; 438/299; 438/300; 438/302; 257/E21.205

(58) Field of Classification Search
    None
    See application file for complete search history.

(56) References Cited

U.S. PATENT DOCUMENTS

| | | | |
|---|---|---|---|
| 7,208,361 B2 * | 4/2007 | Shah et al. | 438/199 |
| 7,595,248 B2 * | 9/2009 | Hattendorf et al. | 438/302 |
| 2001/0036732 A1 * | 11/2001 | Yoshida et al. | 438/689 |
| 2011/0171804 A1 | 7/2011 | Wang et al. | |
| 2011/0207315 A1 | 8/2011 | Wu et al. | |

\* cited by examiner

*Primary Examiner* — Kyoung Lee
(74) *Attorney, Agent, or Firm* — Lowe Hauptman & Ham, LLP

(57) ABSTRACT

The present application discloses a method of forming a semiconductor structure. In at least one embodiment, the method includes forming a polysilicon layer over a substrate. A mask layer is formed over the polysilicon layer. The mask layer is patterned to form a patterned mask layer. A polysilicon structure is formed by etching the polysilicon layer using the patterned mask layer as a mask. The polysilicon structure has an upper surface and a lower surface, and the etching of the polysilicon layer is arranged to cause a width of the upper surface of the polysilicon structure greater than that of the lower surface of the polysilicon structure.

20 Claims, 6 Drawing Sheets

SEMICONDUCTOR STRUCTURE HAVING A POLYSILICON STRUCTURE AND METHOD OF FORMING SAME

BACKGROUND

In the course of integrated circuit (IC) evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices. During the scaling trend, various materials have been implemented for the gate electrode and gate dielectric for CMOS devices.

For example, high-dielectric constant gate dielectric materials and metal gates (HK/MG) have been adopted to enhance electrical performance of CMOS devices. During a gate-last HK/MG process, polysilicon gate electrodes are formed in conjunction with other process for forming the CMOS devices. In a later stage, the polysilicon gate electrodes are removed and replaced with one or more metallic materials.

BRIEF DESCRIPTION OF THE DRAWINGS

One or more embodiments are illustrated by way of examples, and not by limitation, in the figures of the accompanying drawings, wherein elements having the same reference numeral designations represent like elements throughout and wherein.

DETAILED DESCRIPTION

Figure 1:
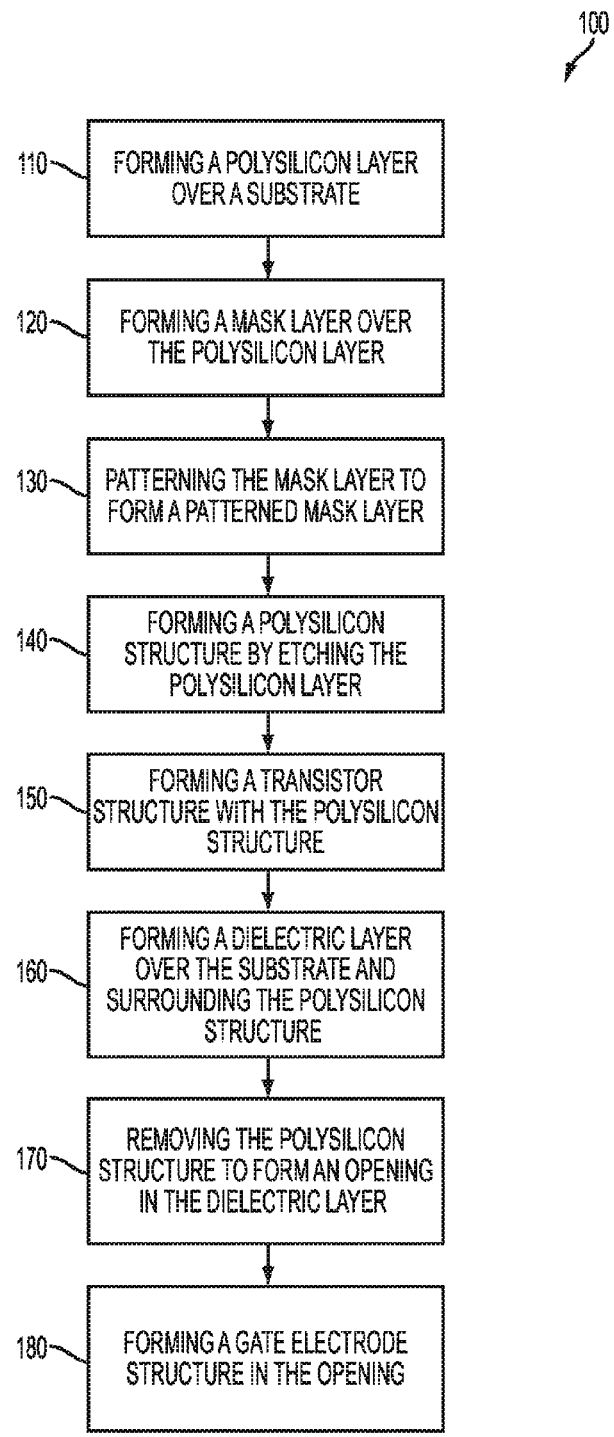
FIG. 1 is a flow chart of a method of manufacturing a semiconductor structure in accordance with some embodiments.

It is understood that the following disclosure provides many different embodiments, or examples, for implementing different features of the disclosure. Specific examples of components and arrangements are described below to simplify the present disclosure. These are, of course, merely examples and are not intended to be limiting. Various features in the drawings are not drawn to scale and are used for illustration purposes only.

The formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a flow chart of a method 100 of manufacturing a semiconductor structure in accordance with some embodiments. It is understood that additional processes may be performed before, during, and/or after the method 100 depicted in FIG. 1, and that some other processes may only be briefly described herein.

Figure 2A:
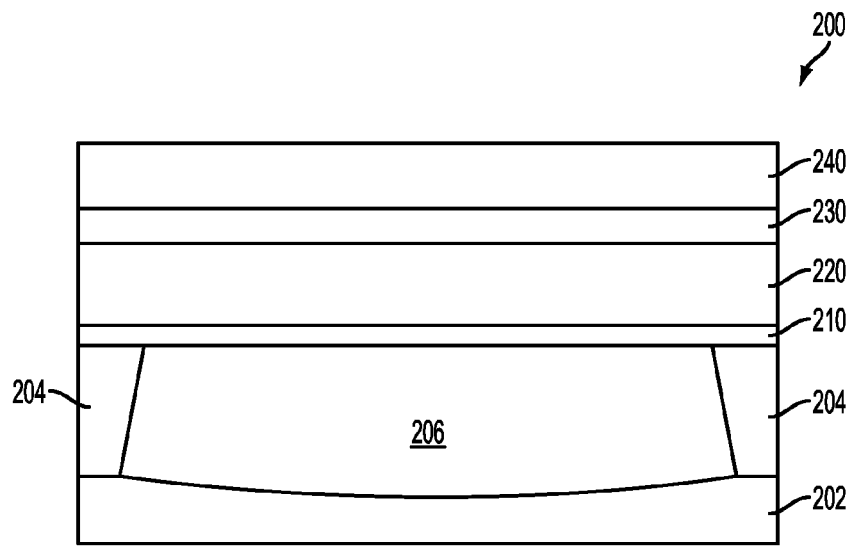
FIGS. 2A-2J are cross-sectional views of a semiconductor structure at various manufacturing stages in accordance with some embodiments.

In operation 110, a polysilicon layer (220 in FIG. 2A) is formed over a substrate layer (202 in FIG. 2A). In operation 120, a mask layer (230 in FIG. 2A) is formed over the polysilicon layer 220. In operation 130, the mask layer 230 is patterned to form a patterned mask layer (232 in FIG. 2B). In at least one embodiment, operation 130 includes forming one or more photoresist (PR) films and one or more anti-reflective (AR) films over the mask layer, patterning the PR films and the AR films to form a patterned PR/AR structure, and etching the mask layer 230, using the PR/AR structure as the patterning mask, to form the patterned mask layer 232. In operation 140, the polysilicon layer 220 is etched, using the patterned mask 232 as the patterning mask, to form a polysilicon structure (222 in FIG. 2C). In at least one embodiment, the polysilicon structure 222 has an upper surface and a lower surface, and the etching of the polysilicon layer is arranged to cause a width of the upper surface of the polysilicon structure to be greater than that of the lower surface of the polysilicon structure 222.

In operation 150, a transistor structure (250 in FIG. 2F) having the polysilicon structure 222 as a dummy gate electrode is formed. In some embodiments, transistor structure 250 has spacers (264 in FIG. 2F) formed on the sidewalls of the polysilicon structure 222. In operation 160, a dielectric layer (270 in FIG. 2G) is formed over the substrate 202 and surrounding the polysilicon structure 222. In operation 170, the polysilicon structure 222 is removed to form an opening (268 in FIG. 2H) in the dielectric layer 270. The opening 268 has a bottom portion and a top portion, and a width of the top portion is greater than that of the bottom portion.

In operation 180, a gate electrode structure (280 in FIG. 2J) is formed in the opening 268. In some embodiments, other operations are performed during, before, or after the method 100 depicted in FIG. 1 to form an integrated circuit chip. The method 100 will be further illustrated in detail in conjunction with FIGS. 2A-2J.

FIGS. 2A-2J are cross-sectional views of a semiconductor structure 200 formed on a wafer at various manufacturing stages in accordance with some embodiments.

As depicted In FIG. 2A, the semiconductor structure 200 has a substrate 202 and one or more insulation structures 204 and a doped well 206 formed in the substrate 202. A gate dielectric layer 210 is formed over the substrate 202 and the doped well 206. A polysilicon layer 220 is formed over the gate dielectric layer 210 and the substrate 202. A mask layer 230 and a photoresist layer 240 are further sequentially formed over the polysilicon layer 220.

In some embodiments, the substrate 202 includes: an elementary semiconductor such as silicon or germanium in crystal, polycrystalline, or an amorphous structure; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In at least one embodiment, the substrate 110 is an alloy semiconductor substrate having a gradient SiGe feature in which the Si and Ge composition change from one ratio at one location to another ratio at another location of the gradient SiGe feature. In another embodiment, the alloy SiGe is formed over a silicon substrate. In yet another embodiment, a SiGe substrate is strained. In some further embodiments, the semiconductor substrate is a semiconductor on insulator. In some examples, the semiconductor substrate includes a doped epitaxial (epi) layer or a buried layer. In other examples, the compound semiconductor substrate has a multilayer structure, or the substrate includes a multilayer compound semiconductor structure.

The one or more insulation structures 204 are at least partially formed within the substrate 202 to define and electrically isolate regions for forming electrical components such as individual metal-oxide semiconductor field effect transistors (MOSFETs). For example, the region defined between the insulation structures 204 depicted in FIG. 2A is for forming a P-channel MOSFET (PMOS transistor) or an N-channel MOSFET (NMOS transistor). In some embodiments, the insulation structures 204 are local oxidation of silicon (LOCOS) structures or shallow trench isolation (STI) structures. In some embodiments, the insulation structures 204 comprise silicon oxide, silicon nitride, silicon oxynitride, fluoride-doped silicate glass (FSG), a low dielectric constant (low-k) dielectric material, other suitable materials, and/or combinations thereof.

The doped well 206 is formed within the region defined by the insulation structures 204. In at least one embodiment for forming a PMOS transistor, the doped well 206 comprises N-type dopant. In at least another embodiment for forming a NMOS transistor, the doped well 206 comprises P-type dopant. In some embodiments, the semiconductor structure 200 comprises an NMOS transistor and/or a PMOS transistor.

The gate dielectric layer 210 is formed over the substrate 202. In some embodiments, the gate dielectric layer 210 includes at least one interfacial dielectric layer and/or at least one high dielectric constant (high-k) dielectric layer. In some embodiments, the interfacial dielectric layer includes a material such as silicon oxide, silicon nitride, silicon oxynitride, other gate dielectric materials, and/or combinations thereof. In some embodiments, the high-k dielectric layer includes a material having a dielectric constant greater than that of $SiO_2$, which is approximately 4. In at least one embodiment, the high-k dielectric layer has a thickness greater than that of the interfacial dielectric layer. In some embodiments, the high-k dielectric layer comprisese $Al_2O_3$, HfO, $HfO_2$, ZrO, $ZrO_2$, ZrSiO, YO, $Y_2O_3$, LaO, $La_2O_5$, GdO, $Gd_2O_5$, TiO, $TiO_2$, TiSiO, TaO, $Ta_2O_5$, TaSiO, HfErO, HfLaO, HfYO, HfGdO, HfAlO, HfZrO, HfTiO, HfTaO, HfSiO, SrTiO, ZrSiON, HfZrTiO, HfZrSiON, HfZrLaO, HfZrAlO, or combinations thereof. In some embodiments, the interfacial dielectric layer and/or the high-k dielectric layer are formed by a chemical vapor deposition (CVD) process, an atomic layer deposition (ALD) process, a thermal oxidation process, a furnace process, other deposition processes, or combinations thereof.

The polysilicon layer 220 is formed over the gate dielectric layer 210 and over the substrate 202 (corresponding to operation 110 of FIG. 1). In at least one embodiment, the polysilicon layer comprises polycrystalline silicon. In some embodiments, the polysilicon layer is formed by a CVD process or a low-pressure CVD (LPCVD) process.

The mask layer 230 is then formed over the polysilicon layer 220 (corresponding to operation 120 of FIG. 1). In some embodiments, the mask layer 230 includes two or more sub-layers, such as a lower mask layer and an upper mask layer formed over the lower mask layer. In some embodiments, the lower mask layer comprises carbon, hydrogen, and oxide. In some embodiments, the upper mask layer comprises silicon, carbon, hydrogen, and oxide. For patterning the mask layer 230, the photoresist layer 240 is further formed over the mask layer 230 (corresponding to operation 130 of FIG. 1). In some embodiments, the photoresist layer 240 includes one or more PR films and one or more AR films over the mask layer 230. In some embodiments, the PR films comprise $SiO_2$, SiN, silicon oxynitride, silicon carbide, or combinations thereof, and the AR films comprise silicon, carbon, and oxide.

Figure 2B:
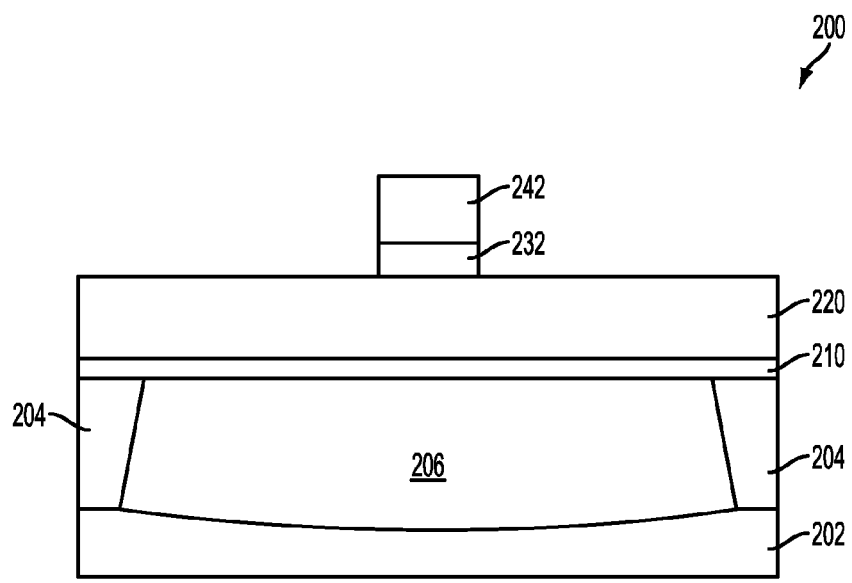

As depicted in FIG. 2B, the photoresist layer 240 is patterned to form a patterned PR/AR structure 242. Then the mask layer 230 is etched, using the PR/AR structure 242 as the patterning mask, to form a patterned mask layer 232. In some embodiments, etching of the mask layer 230 is performed by a dry etching process using a gas mixture of $NF_3$, $SF_6$, Ar, $CF_4$, $CHF_3$, $CH_4$, $N_2$, $O_2$, $Cl_2$, and/or HBr and under a pressure ranging from about 1 millitorr(mtorr) to about 50 mtorr. In some embodiments, etching of the mask layer 230 is performed by a wet etching process using a solvent being a mixture of HF, $H_2O$, HF, $NH_4F_4$, $NH_4OH$, $HNO_3$, $H_2O_2$, and/or $H_2SO_4$ and at a temperature ranging from about 40° C. to about 20° C.

Figure 2C:
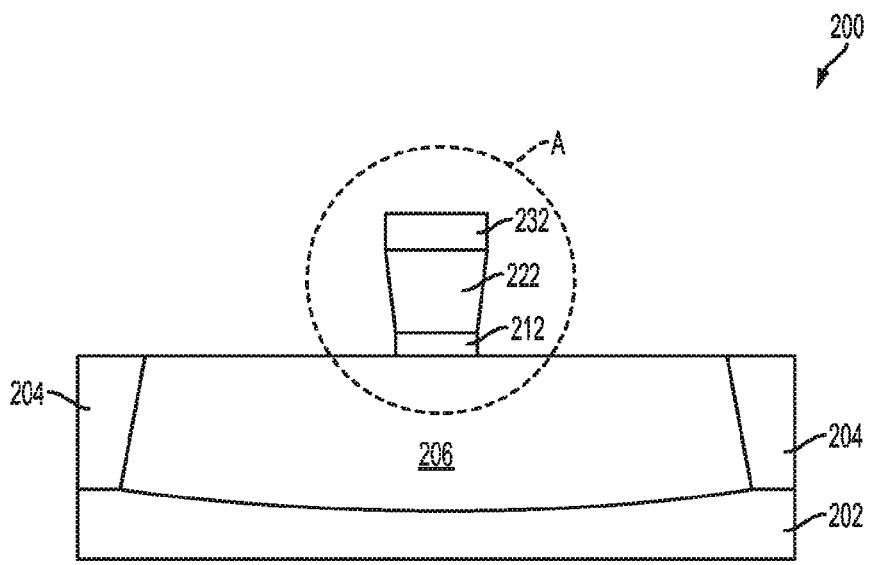
Figure 2D:
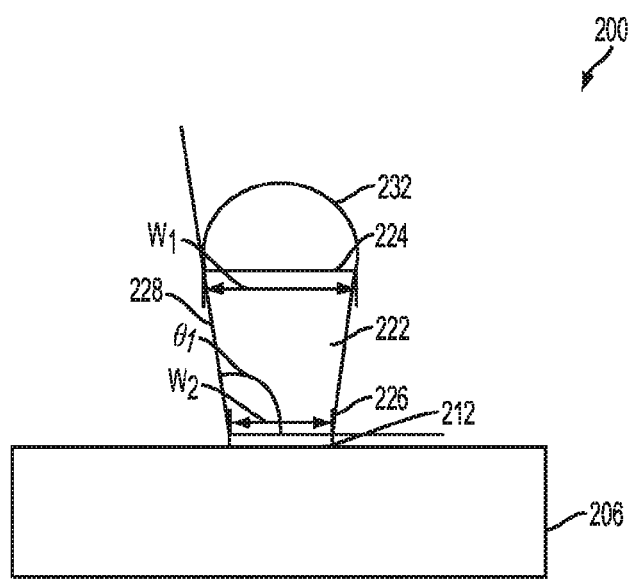

As depicted in FIG. 2C, the polysilicon layer 220 is etched, using the patterned mask layer 232 as the patterning mask, to form a polysilicon structure 222 (corresponding to operation 140 of FIG. 1). In some embodiments, the gate dielectric layer 210 is also etched to form a patterned gate dielectric layer 212. FIG. 2D is an enlarged view of portion A in FIG. 2C. As depicted in FIG. 2D, the etching of the polysilicon layer 220 is arranged to cause a width $W_1$ of the upper surface 224 of the polysilicon structure 222 to be greater than a width $W_2$ of the lower surface 226 of the polysilicon structure 222. In some embodiments, etching of the polysilicon layer 220 includes performing a dry etching process in an environment having $Cl_2$ gas and $CF_4$ gas, and a ratio of the $Cl_2$ gas to the $CF_4$ gas is greater than a predetermined threshold value. In at least one embodiment, the predetermined threshold value for the ratio ranges from about 0.5 to about 10. In some embodiments, the sidewall 228 of the polysilicon structure 222 and the lower surface 226 of the polysilicon structure 222 define a sidewall angle $\theta_1$ ranges from about 90 degrees to about 110 degrees.

In some embodiments, the etching of the polysilicon layer 220 further includes, after the dry etching process, performing a wet cleaning for a first predetermined period of time to remove residues and contaminants on the sidewalls of the polysilicon structure 222 and a second predetermined period of time to further reduce the width $W_2$ of the lower surface 226 of the polysilicon structure 222. In at least one embodiment, the first predetermined period of time for the wet cleaning process ranges from about 5 to about 50 seconds, and the second predetermined period of time for the wet-cleaning ranges from about 30 to about 200 second. In at least one embodiment, the entire wet cleaning process is performed for a period of time ranging from about 5 to about 50 seconds.

Figure 2E:
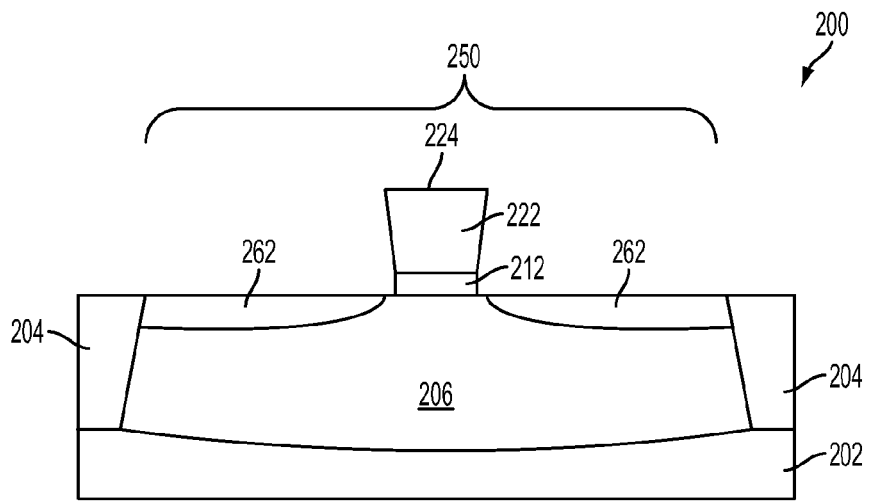
Figure 2F:
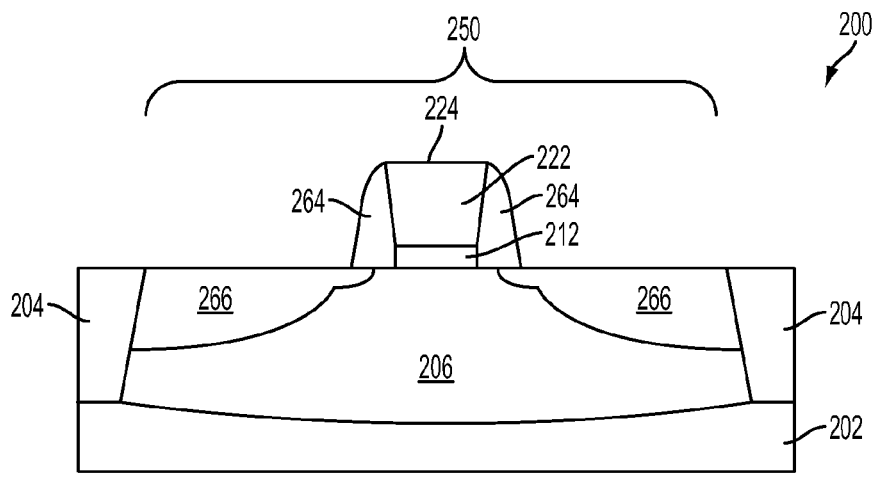

As depicted in FIGS. 2E and 2F, a transistor structure 250 having the polysilicon structure 222 as a dummy gate electrode is formed (corresponding to operation 150 of FIG. 1). The patterned mask layer 232 is removed by an ashing process. In some embodiments, P-type dopant, such as boron, or N-type dopant, such as phosphorus or arsenic, is implanted, using the polysilicon structure 222 as the mask, into the doped well 206 to form light-doped regions (LDDs) 262 (FIG. 2E). Spacers 264 are further formed on the sidewalls of the polysilicon structure 222. Using the spacers 264 as the mask, P-type dopant or N-type dopant is further implanted into the substrate 202 to form source/drain regions 266 of the transistor structure 250 (FIG. 2F). In some embodiments, the spacers 264 are formed by using a deposition process and an etching process (for example, an anisotropic etching process), and the spacers 264 include silicon nitride, silicon oxide, silicon carbide, silicon oxynitride, or combinations thereof. In some embodiments, a thermal process and/or a rapid thermal process (RTP) are performed to activate dopants in the source/drain regions 266.

Figure 2G:
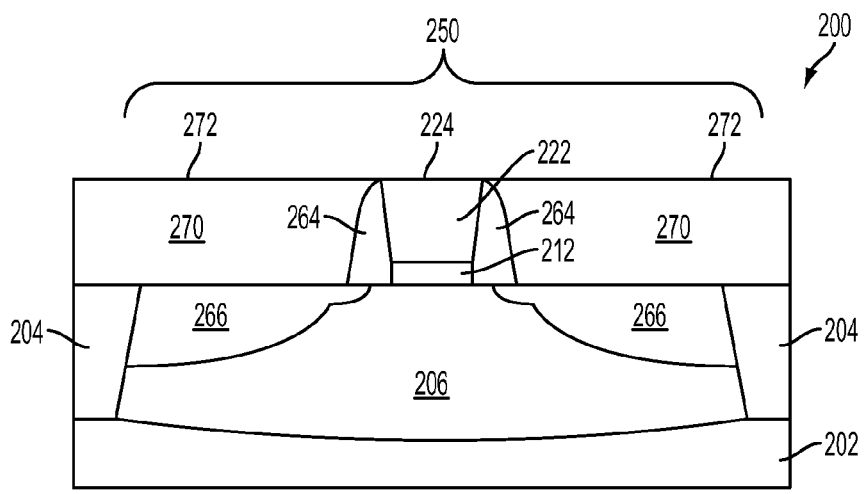

As depicted in FIG. 2G, a dielectric layer 270 is formed (corresponding to operation 160 of FIG. 1) over the substrate 202 and surrounding the polysilicon structure 222. In some embodiments having the spacers 264 formed on the sidewalls of the polysilicon structure 222, the dielectric layer 270 is disposed immediately adjacent to the outer walls 265 of the spacers 264. In at least one embodiment having no spacer, the dielectric layer 270 is disposed immediately adjacent to the sidewalls of the polysilicon structure 222. In some embodiments, the dielectric layer 270 includes spin-on glass (SOG), fluorinated silica glass (FSG), phosphorous-doped silicate glass (PSG), boron-doped silicate glass (BSG), boron-phosphorous-doped silicate glass (BPSG), undoped silicate glass (USG), silicon oxide, silicon nitride, silicon oxynitride, low dielectric constant (low-k) dielectric material, carbon doped silicon oxide (e.g. SiCOH), BLACK DIAMOND® (Applied Materials, Santa Clara, Calif., USA), and/or combinations thereof. In some embodiments, the dielectric layer 270 is formed by CVD, LPCVD, high density plasma deposition (HDP), spinning on glass, or any suitable process. In some embodiments, an upper surface 272 of the dielectric layer 270 is coplanar with the upper surface 224 of the polysilicon structure 222. For example, dielectric layer 270 is processed by different temperature/pressure by a compress contact etch stop layer (cCESL) method or a tensile contact etch stop layer (tCESL) method, and then followed by a chemical-mechanical-polishing (CMP) process until the upper surface 224 of the polysilicon structure 222 is exposed.

Figure 2H:
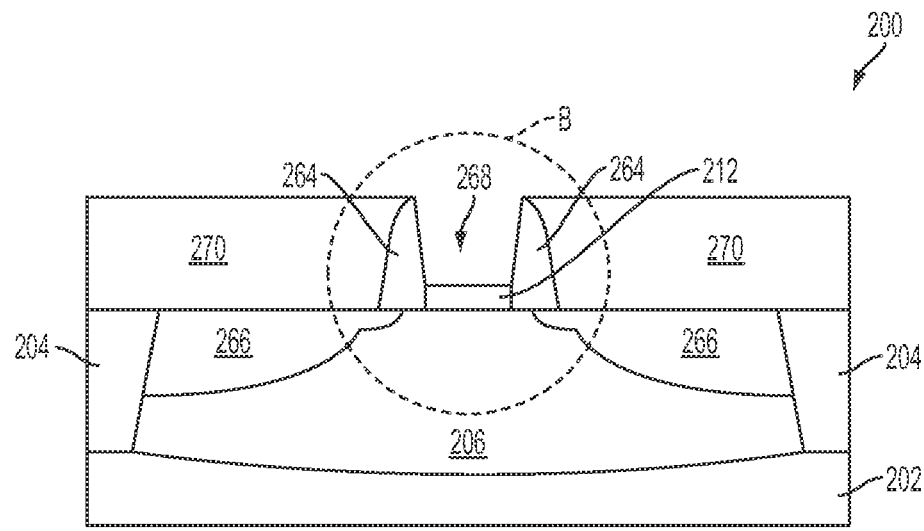
Figure 2I:
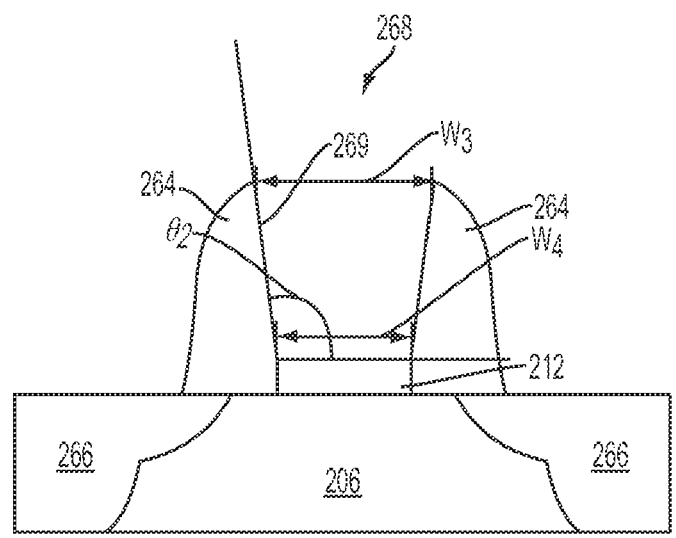

As depicted in FIG. 2H, the polysilicon structure 222 is removed to form an opening 268 in the dielectric layer (corresponding to operation 170 of FIG. 1). FIG. 2I is an enlarged view of portion B in FIG. 2H. As depicted in FIG. 2I, the opening 268 has a bottom portion and a top portion, and a width $W_3$ of the top portion is greater than a width $W_4$ of the bottom portion of the opening 268. In some embodiments, the bottom portion and a side wall 269 of the opening 268 define a sidewall angle $\theta_2$ which ranges from about 90 degrees to about 110 degrees. In at least one embodiment having no spacer, a tilt etching process is further performed to round corners of the dielectric layer 270 at the opening 268 to enlarge a ratio of the width $W_3$ of the top portion of the opening 268 to the width $W_4$ of the bottom portion of the opening 268.

In some embodiments, according to the profiles of the polysilicon structure 222 and the opening 268, the width $W_2$ and the width $W_4$ are substantially the same, but the width $W_3$ is about 2 nm less than the width $W_1$. One of the reasons for causing the reduced width is because of the compressive stress of the dielectric layer 270. Therefore, in at least one embodiment, the formation of the dielectric layer 270 is arranged to cause the dielectric layer 270 to have a stress level that provides reduced stress, no stress, or a tensile stress on a sidewall of the polysilicon structure 224.

Figure 2J:
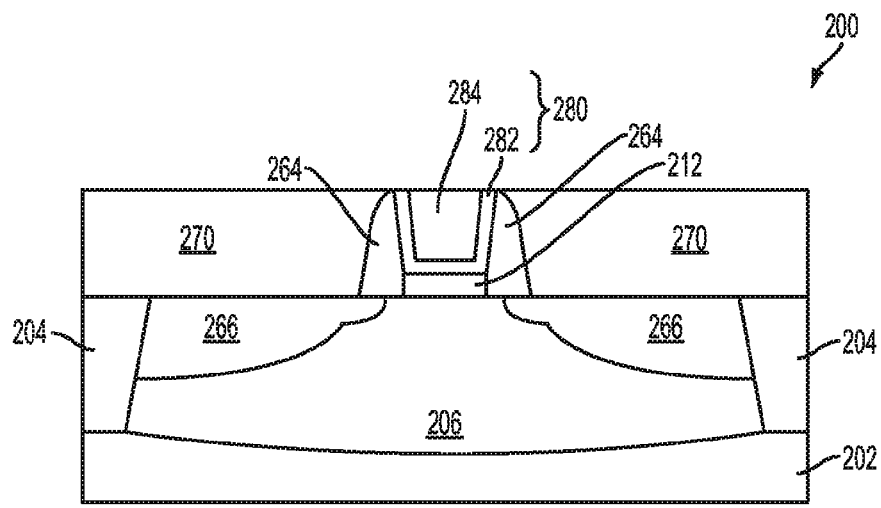

As depicted in FIG. 2J, a gate electrode structure 280 is formed in the opening 268 (FIG. 2H). The gate electrode structure 280 depicted in FIG. 2J includes a work-function layer 282 and a conductive layer 284. In some embodiments, the gate electrode 280 further includes one or more layers of aluminum, copper, aluminum-copper, tungsten, titanium, tantulum, tantalum aluminum, tantalum aluminum nitride, titanium nitride, tantalum nitride, nickel silicide, cobalt silicide, silver, TaC, TaSiN, TaCN, TiAl, TiAlN, WN, barrier materials, and/or combinations thereof.

The work-function layer 282 comprises P-type work-function metal or N-type work-function metal. In some embodiments, the P-type work-function metal includes ruthenium, palladium, platinum, cobalt, nickel, or conductive metal oxides. The N-type work-function metal includes hafnium, zirconium, titanium, tantalum, aluminum, metal carbides (e.g., hafnium carbide, zirconium carbide, titanium carbide, aluminum carbide), or aluminides. In some embodiments, work-function layer 282 is formed by performing an atomic layer deposition (ALD) process, CVD process, an RPCVD process, a plasma-enhanced CVD (PECVD) process, a metal-organic CVD (MOCVD) process, or any combinations thereof.

In some embodiments, the conductive layer 284 comprises aluminum, copper, Ti, TiN, TaN, Ta, TaC, TaSiN, W, WN, MoN, MoON, $RuO_2$, and/or combinations thereof. In some embodiments, the conductive layer 280 is formed by performing an ALD process, a CVD process, a physical vapor deposition (PVD) process, an RPCVD process, a PECVD process, an MOCVD process, a plating process, a sputtering process, or combinations thereof.

In some embodiments, other electrical components, one or more interconnection layers, passivation layers, and/or bump structures are formed with the semiconductor structure on the wafer to complete an integrated circuit.

Figure 3:
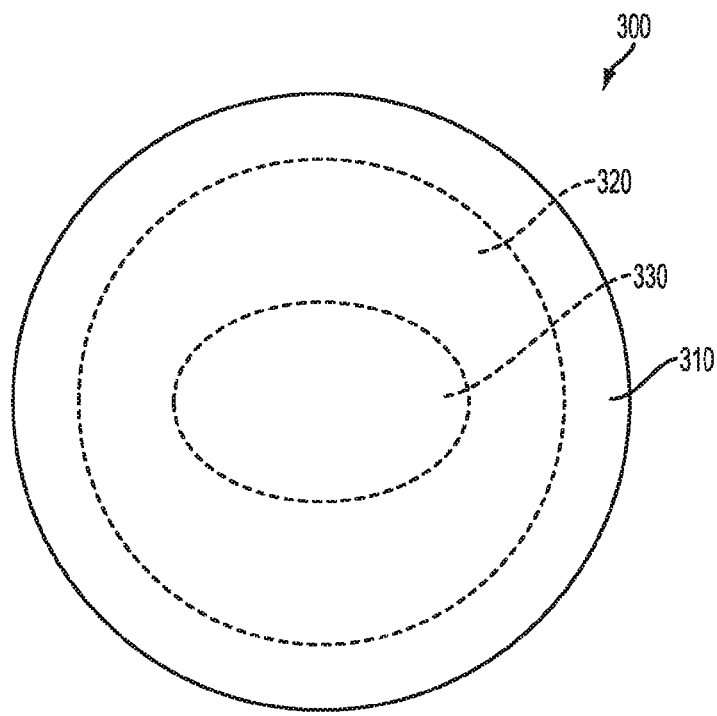
FIG. 3 is a schematic top view of a wafer having the semiconductor structure as depicted in FIG. 2J formed thereon in accordance with some embodiments.

FIG. 3 is a schematic top view of a wafer 300 having the semiconductor structure 200 as depicted in FIG. 2J formed thereon in accordance with some embodiments. The reentrant profile of the polysilicon structure 222 as described above improves uniformity in forming the work-function layer 282 and/or the conductive layer 284 on the wafer 300, and thus allows consistent transistor performance throughout the wafer 300. Because of process variations, the sidewall angles $\theta_1$ or $\theta_2$ (FIGS. 2D and 2I) various throughout the entire surface of the wafer 300. Therefore, in at least one embodiment, the formation of the polysilicon structure 222 and/or the removal of the polysilicon structure 222 are arranged so that at least 90% of the semiconductor structures 200 formed on the wafer 300 have the sidewall angles $\theta_1$ or $\theta_2$ greater than 90 degrees. In one example, the sidewall angles $\theta_1$ or $\theta_2$ observed in zone 310 are larger than those observed in zone 320, and the sidewall angles $\theta_1$ or $\theta_2$ observed in zone 320 are larger than those observed in zone 330. Thus, in this particular example, the formation of the polysilicon structure 222 and/or the removal of the polysilicon structure 222 are arranged so that all of the semiconductor structures 200 formed in the zone 310 and zone 320 on the wafer 300 have the sidewall angles $\theta_1$ or $\theta_2$ greater than 90 degrees.

In accordance with some embodiments, a method of forming a semiconductor structure includes forming a polysilicon layer over a substrate. A mask layer is formed over the polysilicon layer. The mask layer is patterned to form a patterned mask layer. A polysilicon structure is formed by etching the polysilicon layer using the patterned mask layer as a mask. The polysilicon structure has an upper surface and a lower surface, and the etching of the polysilicon layer is arranged to cause a width of the upper surface of the polysilicon structure to be greater than that of the lower surface of the polysilicon structure.

In accordance with some other embodiments, a method of forming a semiconductor structure includes forming a polysilicon layer over a substrate. The polysilicon layer is patterned to form a polysilicon structure. A dielectric layer is formed over the substrate and surrounding the polysilicon structure. The polysilicon structure is removed to form an opening in the dielectric layer. The opening has a bottom portion and a top portion, and a width of the top portion is greater than that of the bottom portion.

In accordance with yet some other embodiments, a semiconductor structure includes a substrate, a polysilicon structure formed over the substrate, and a patterned mask layer formed over the polysilicon structure. The polysilicon structure has an upper surface and a lower surface, and a width of the upper surface of the polysilicon structure is greater than that of the lower surface of the polysilicon structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure comprising:
    forming a polysilicon layer over a substrate;
    forming a mask layer over the polysilicon layer;
    patterning the mask layer to form a patterned mask layer;
    forming a polysilicon structure by etching the polysilicon layer using the patterned mask layer as a mask; and
    forming a dielectric layer over the substrate and surrounding the polysilicon structure, wherein the dielectric layer is arranged to provide no stress or a tensile stress on a sidewall of the polysilicon structure,
    the polysilicon structure having an upper surface and a lower surface, and the etching of the polysilicon layer being arranged to cause a width of the upper surface of the polysilicon structure to be greater than that of the lower surface of the polysilicon structure.

2. The method of claim 1, wherein polysilicon structure has a sidewall, and the sidewall and the lower surface of the polysilicon structure define a sidewall angle which ranges from about 90 degrees to about 110 degrees.

3. The method of claim 1, wherein the etching of the polysilicon layer comprises performing a dry etching in an environment having $Cl_2$ gas and $CF_4$ gas.

4. The method of claim 3, wherein the etching of the polysilicon layer has a ratio of the $Cl_2$ gas to the $CF_4$ gas greater than a predetermined threshold value.

5. The method of claim 4, wherein the predetermined threshold ranges from about 0.5 to about 10.

6. The method of claim 1, wherein the etching of the polysilicon layer comprises performing a wet cleaning for a predetermined period of time ranging from about 5 to about 50 seconds.

7. The method of claim 6, wherein the wet cleaning comprises:
    removing residue from the sidewalls for a first predetermined period of time; and
    reducing a width of the lower surface of the polysilicon structure for a second predetermined period of time.

8. The method of claim 1, wherein an upper surface of the dielectric layer is coplanar with the upper surface of the polysilicon structure.

9. The method of claim 1, further comprising:
    forming a gate dielectric layer between the substrate and the polysilicon layer; and
    etching the gate dielectric layer using the patterned mask layer as a mask.

10. A method of forming a semiconductor structure comprising:
    forming a polysilicon layer over a substrate;
    patterning the polysilicon layer to form a polysilicon structure;
    forming a dielectric layer over the substrate and surrounding the polysilicon structure;
    removing the polysilicon structure to form an opening in the dielectric layer;
    rounding corners of the dielectric layer at the opening to enlarge a ratio of the width of the top portion of the opening to that of the bottom portion of the opening,
    the opening having a bottom portion and a top portion, and a width of the top portion being greater than that of the bottom portion.

11. The method of claim 10, wherein the opening having a sidewall, and the bottom portion and the sidewall of the opening define a sidewall angle which ranges from about 90 degrees to about 110 degrees.

12. The method of claim 10, wherein the patterning of the polysilicon layer comprises performing a dry etching in an environment having $Cl_2$ gas and $CF_4$ gas.

13. The method of claim 12, wherein the etching of the polysilicon layer has a ratio of the $Cl_2$ gas to the $CF_4$ gas greater than a predetermined threshold value.

14. The method of claim 13, wherein the predetermined threshold ranges from about 0.5 to about 10.

15. The method of claim 10, wherein the removal of the polysilicon structure comprises performing a wet cleaning for a predetermined period of time ranging from about 30 to about 200 seconds.

16. The method of claim 10, wherein the forming the dielectric layer is arranged to cause the dielectric layer to have a stress level that provides no stress or a tensile stress on a sidewall of the polysilicon structure.

17. A semiconductor structure comprising:
    a substrate;
    a polysilicon structure formed over the substrate; and
    a patterned mask layer formed over the polysilicon structure, wherein the mask layer comprises:
        a silicon nitride layer formed over the polysilicon structure; and
        a silicon oxide layer formed over the silicon nitride layer,
    the polysilicon structure having an upper surface and a lower surface, and a width of the upper surface of the polysilicon structure being greater than that of the lower surface of the polysilicon structure.

18. The semiconductor structure of claim 17, wherein the polysilicon structure has a sidewall, and the bottom surface and the sidewall of the polysilicon structure define a sidewall angle ranging from about 90 degrees to about 110 degrees.

19. The semiconductor structure of claim 17, further comprising:
    a dielectric layer over the substrate and surrounding the polysilicon structure, the dielectric layer being arranged to have a stress level that provides no stress or a tensile stress on a sidewall of the polysilicon structure.

20. The semiconductor structure of claim 17, further comprising:
    a gate dielectric layer formed over the substrate and under the polysilicon structure.

* * * * *